United States Patent [19]

Hagino et al.

[11] Patent Number: 4,841,179

[45] Date of Patent: Jun. 20, 1989

[54] PHASE EQUALIZING ACTIVE FILTER

[75] Inventors: Hideyuki Hagino, Fukaya; Takahiro Kusano, Kumagaya, both of Japan

[73] Assignee: Kabushiki Kaisha Toshiba, Kawasaki, Japan

[21] Appl. No.: 136,968

[22] Filed: Dec. 23, 1987

[30] Foreign Application Priority Data

Dec. 26, 1986 [JP] Japan .................................. 61-315355

[51] Int. Cl.$^4$ ........................... H03B 1/00; H03K 5/00
[52] U.S. Cl. ..................................... 307/520; 328/167; 328/155; 330/107; 333/28 R
[58] Field of Search ............... 307/520, 521, 511, 262; 328/167, 155; 333/28 R; 330/278, 294, 304, 107, 109

[56] References Cited

U.S. PATENT DOCUMENTS

| | | | |
|---|---|---|---|
| 4,257,006 | 3/1981 | Schaumann | 307/520 X |
| 4,336,501 | 6/1982 | Ishikawa et al. | 330/294 X |
| 4,417,215 | 11/1983 | Kleinberg | 330/109 X |
| 4,675,616 | 6/1987 | Yamashita | 330/294 X |

Primary Examiner—Stanley D. Miller
Assistant Examiner—Timothy P. Callahan
Attorney, Agent, or Firm—Cushman, Darby & Cushman

[57] ABSTRACT

A first operational amplifier (OP AMP) is connected at the positive input terminal to a signal input terminal. The positive output terminal of the first OP AMP is connected to a ground through a first capacitor, and to the positive input terminal of a second OP AMP. The positive output terminal of the second OP AMP is connected to positive input terminal of the first OP AMP via a second capacitor, and to the input terminal of a buffer. The output terminal of the buffer is connected to the negative input terminal of the first OP AMP, and to the positive input terminal of the first OP AMP via the connected series of the first and second resistors. The connection point of these resistors is connected to the negative input terminal of the second OP AMP. The output terminal of the buffer is connected to a signal output terminal. When the resistances of these resistors are equal, the circuit has a phase equalizer characteristic.

8 Claims, 2 Drawing Sheets

PHASE EQUALIZING ACTIVE FILTER

BACKGROUND OF THE INVENTION

This invention relates to an active filter, and more particularly to an active filter used as a phase equalizer.

Active filters have been used for video tape recorders (VTRs) and television (TV) receivers. This type of filter may be used as a band emphasis filter (BEF), band deemphasis filter (BDF) or phase equalizer, depending on its gain characteristic.

The phase equalizer generally means a circuit whose gain characteristic is fixed and not dependent on the frequency, and phase only is variable.

The transfer function of this circuit is generally expressed by a complex number whose numerator and dominator are conjugate to each other as given below $$H(\omega) = \frac{f(\omega) - jg(\omega)}{f(\omega) + jg(\omega)} \times K$$

where K is a real constant. The gain characteristic $G(\omega)$ and phase characteristic $\phi(\omega)$ of this circuit are $$G(\omega) = \sqrt{\frac{f^2(\omega) + \{-g(\omega)\}^2}{f^2(\omega) + g^2(\omega)}} \times K = K = \text{constant}$$

$$\theta(\omega) = -2 \text{ Arc tan} \frac{g(\omega)}{f(\omega)}$$

As seen from the above expressions, the phase equalizer has the phase equalizing function.

In a practical use of this type of filter, input signal X(S) is supplied to the positive input terminal of a first operation amplifier (OP AMP) of the differential input-/output type. The positive output terminal of the first OP AMP is connected to the positive input terminal of a second OP AMP of the differential input type. The positive input terminal of the second OP AMP is connected to one terminal of a first capacitor. The other terminal of the capacitor is grounded in an AC mode. The positive output terminal of the second OP AMP is connected to the negative output terminal of the first OP AMP, and connected to the positive input terminal of the first OP AMP, through a second capacitor. The positive output terminal of the second OP AMP is connected to the input terminal of a buffer. The output terminal of this buffer is connected to the negative input terminals of the first and second OP AMPs. The output terminal of the buffer provides output signal Y(S).

The input/output characteristic of the active filter is given by $$\frac{Y(S)}{X(S)} = \frac{S^2 - \frac{gm_1}{C_2}S + \frac{gm_1 gm_2}{C_1 C_2}}{S^2 + \frac{gm_2 - gm_1}{C_2}S + \frac{gm_1 gm_2}{C_1 C_2}} \quad (1)$$

where $gm_1$ and $gm_2$ are the incremental transfer conductances of the first and second OP AMPs, and $C_1$ and $C_2$ are capacitances of the first and second capacitor. In the equation (1), if the conductances $gm_1$ and $gm_2$ are selected as below, $$gm_2 - gm_2 = gm_1 \quad (2)$$

the equation (1) describes the phase equalizer characteristics. In the equation (1), if $S = j\omega$, the equation (1) can be rewritten into $$\frac{Y(\omega)}{X(\omega)} = \frac{-\omega^2 - j\omega \frac{gm_1}{C_2} + \frac{gm_1 gm_2}{C_1 C_2}}{-\omega^2 + j\omega \frac{gm_2 - gm_1}{C_2} + \frac{gm_1 gm_2}{C_1 C_2}}$$

where $\omega$ is an angular frequency, and j indicates the conjugate.

The gain characteristic is defined as an absolute value of the transfer function, and therefore we have $$G(\omega) = \left| \frac{Y(\omega)}{X(\omega)} \right| =$$

$$\sqrt{\frac{\left(\frac{gm_1 gm_2}{C_1 C_2} - \omega^2\right)^2 + \omega^2 \left(\frac{gm_1}{C_2}\right)^2}{\left(\frac{gm_1 gm_2}{C_1 C_2} - \omega^2\right)^2 + \omega^2 \left(\frac{gm_2 - gm_1}{C_2}\right)^2}}$$

Substituting the equation (2) into the above equation, we have $$G(\omega) = \sqrt{\frac{\left(\frac{gm_1 gm_2}{C_1 C_2} - \omega^2\right)^2 + \omega^2 \left(\frac{gm_1}{C_2}\right)^2}{\left(\frac{gm_1 gm_2}{C_1 C_2} - \omega^2\right)^2 + \omega^2 \left(\frac{gm_1}{C_2}\right)^2}} = 1$$

The above equation indicates an all-pass filter, which has the gain of 1 and is independent from the frequency. The phase characteristic of this filter is $$\theta(\omega) = \text{Arc tan} \frac{-\omega \frac{gm_1}{C_2}}{\frac{gm_1 gm_2}{C_1 C_2} - \omega^2} - \text{Arc tan} \frac{\omega \frac{gm_2 - gm_1}{C_2}}{\frac{gm_1 gm_2}{C_1 C_2} - \omega^2}$$

Substituting the equation (2) into the above equation, we have $$\theta(\omega) = -2 \text{ Arc tan} \frac{\omega \frac{gm_1}{C_2}}{\frac{gm_1 gm_2}{C_1 C_2} - \omega^2}$$

The above equation describes the characteristic of the phase equalizer whose gain is fixed and phase only is variable.

In realizing the active filter as mentioned above, we can easily consider a most primitive OP AMP made up of four transistors and a single constant current source. First and second transistors are paired. The first transistor is an NPN transistor, which is connected at the emitter to the constant current source, and connected at the base to the negative input terminal of the OP AMP. The second transistor is an NPN transistor, which is connected at the emitter to the constant current circuit, and at the base to the positive input terminal of the OP AMP. Third and fourth transistors are paired. The third transistor is a PNP transistor whose emitter is connected to an operation power supply and collector is connected to the collector of the first transistor. The fourth transistor is a PNP transistor whose emitter is connected to the operation power supply and collector is connected to the collector of the second transistor. The bases of the third and fourth transistors are connected together and to the collector of the fourth transistor. The output (positive) of the OP AMP is derived from the collector of the third transistor.

The basic OP AMP thus arranged has one terminal as the output terminal. To construct the OP AMP with positive and negative output terminals, as in the first OP AMP in the active filter, two basic OP AMPs are needed. Therefore, to construct the active filter by using the basic OP AMPs, three OP AMPs must be used. Thus, the filter circuit is made complicated. If the filter is fabricated into an IC circuit, it is advantageous if its circuit construction is simplified.

To use the active filter as the phase equalizer, viz., to obtain the phase equalizer characteristics, it is necessary to equal the difference between the incremental transfer conductance $gm_1$, and the conductance $gm_2$ to the conductance $gm_1$.

To realize the equation (2), $gm_2 - gm_1 = gm_1$, the ratio of $gm_1$ and $gm_2$ must be set to 1:2, exactly.

Since this factor gm is determined by all of the transistors and the constant current source in the OP AMP, to obtain the well paired conductances $gm_1$ and $gm_2$, the constants of all of the elements must be exactly equal between the first OP AMP and the second OP AMP.

The prior art circuit can not realize the equation (2) satisfactorily. Thus, it is a present technical problem as to how the active filter can be IC fabricated.

SUMMARY OF THE INVENTION

Accordingly, an object of this invention is to provide an active filter which requires a lower number of operational amplifiers, and is suitable for IC fabrication.

To achieve the above object, there is provided an active filter comprising a signal input terminal coupled for reception with an input signal, a first operational amplifier with positive and negative input terminals and a positive output terminal, the positive input terminal being connected to the signal input terminal, and the positive output terminal being grounded through a first capacitor, a second operational amplifier with positive and negative input terminals and a positive output terminal, the positive input terminal being connected to the positive output terminal of the first operational amplifier, and the positive output terminal being connected to the positive input terminal of the first operational amplifier, through a second capacitor, a buffer with input and output terminals, the input terminal being connected to the positive output terminal of the second operational amplifier, and the output terminal being connected to the negative input terminal of the first operational amplifier, a first resistor connected at its first end to the positive input end of its first operational amplifier and connected at the second end to the negative input terminal of the second operational amplifier, a second resistor connected at its first end to the second end of the first resistor, and at its second end to the output terminal of the buffer, and a signal output terminal connected to the output terminal of the buffer.

DETAILED DESCRIPTION OF THE PREFERRED EMBODIMENTS

Some specific preferred embodiments of this invention will be described referring to the accompanying drawings.

Figure 1:
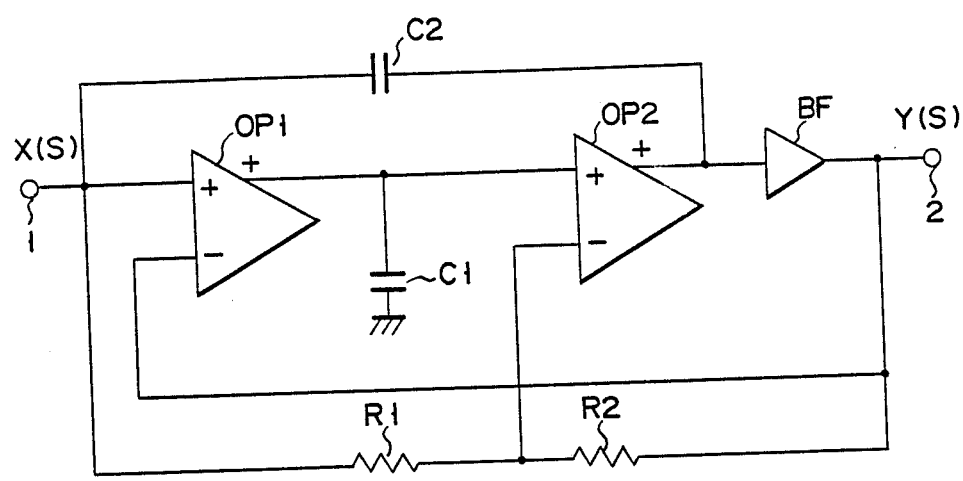
FIG. 1 shows a circuit diagram of an arrangement of an active filter according to an embodiment of this invention.

FIG. 1 shows a circuit diagram illustrating an arrangement of a first embodiment according to this invention. In the figure, input signal X(S), as input to signal input terminal 1, is supplied to the positive input terminal of a first operation amplifier (OP AMP) $OP_1$ of the differential input type. The positive output terminal of OP AMP $OP_1$ is connected to the positive input terminal of a second OP AMP $OP_2$ of the differential input type. The positive input terminal of OP AMP $OP_2$ is connected to one terminal of a first capacitor $C_1$. The other terminal of capacitor $C_1$ is grounded in an AC mode. The positive output terminal of OP AMP $OP_2$ is connected to the input terminal of a buffer BF, and connected to the positive input terminal of OP AMP $OP_1$, through a second capacitor $C_2$. The output terminal of buffer BF is connected to the negative input terminal of OP AMP $OP_1$, and connected to the positive input terminal of OP AMP $OP_1$, through a first resistor $R_1$ and a second resistors $R_2$, which are serially connected. The connection point between resistor $R_1$ and resistor $R_2$ is connected to the negative input terminal of OP AMP $OP_2$. The output signal Y(S) is derived from the output terminal of buffer BF, and output at the signal output terminal 2.

Figure 2:
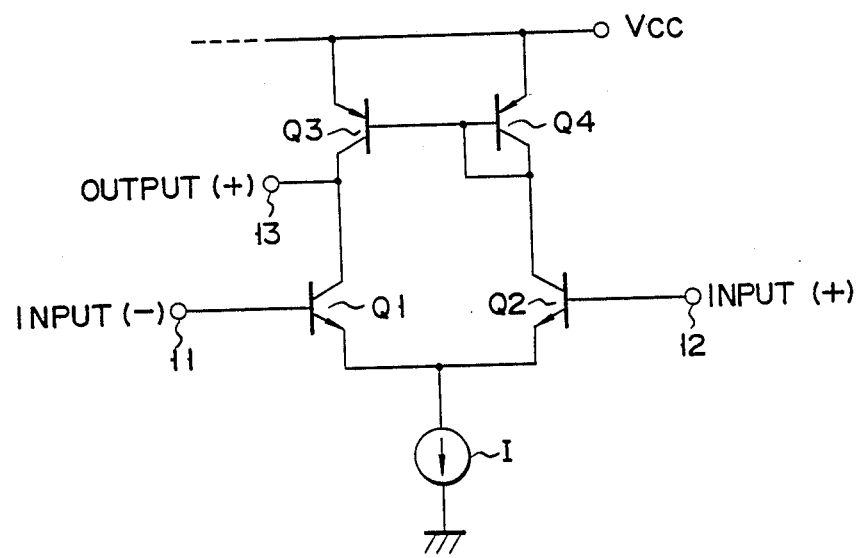
FIG. 2 shows a circuit diagram illustrating a detailed circuit arrangement of the operational amplifier shown in FIG. 1.

The first and second operational amplifiers $OP_1$, $OP_2$ are each made up of four transistors $Q_1 \sim Q_4$, and a single constant current source I, as shown in FIG. 2.

First and second transistors $Q_1$, $Q_2$ are paired. Transistor $Q_1$ is an NPN transistor, which is connected at the emitter to constant current source I, and connected at the base to the negative input terminal 11 of the OP AMP. Transistor $Q_2$ is an NPN transistor, which is connected at the emitter to constant current circuit I, and at the base to the positive input terminal 12 of the OP AMP. Third and fourth transistors $Q_3$, $Q_4$ are paired. Transistor $Q_3$ is a PNP transistor whose emitter is connected to an operation power supply Vcc and whose collector is connected to the collector of transistor $Q_1$. Transistor $Q_4$ is a PNP transistor whose emitter is connected to operation power supply Vcc and whose collector is connected to the collector of transistor $Q_2$. The bases of transistors $Q_3$, $Q_4$ are joined and connected together to the collector of transistor $Q_4$. The collector of transistor $Q_3$ is connected to output terminal 13 of the OP AMP, from which the output (positive) is derived.

In the active filter thus arranged, the input and output signals are related by the following relation, $$Y(S) = \quad (3)$$

$$X(S) + \frac{gm_2}{C_2 S}\left[\frac{gm_1}{C_1 S}\{X(S) - Y(S)\} - \frac{R_1 Y(S) + R_2 X(S)}{R_1 + R_2}\right]$$

where $gm_1$ and $gm_2$ are the incremental transfer conductances of OP AMPs $OP_1$, $OP_2$. To obtain the transfer function of the filter, rearranging the above equation (3), we have:

$$\frac{Y(S)}{X(S)} = \frac{S^2 - \frac{R_2}{R_1 + R_2}\frac{gm_2}{C_2}S + \frac{gm_1 gm_2}{C_1 C_2}}{S^2 + \frac{R_1}{R_1 + R_2}\frac{gm_2}{C_2}S + \frac{gm_1 gm_2}{C_1 C_2}} \quad (4)$$

In the equation (4), if the series connected resistors have equal resistance, $$R_1 = R_2$$

the equation (4) describes the phase equalizer characteristics. This implies that the FIG. 1 active filter serves as a phase equalizer.

Substituting $j\omega$ into S in the equation (4), we have:

$$\frac{Y(\omega)}{X(\omega)} = \frac{-\omega^2 - j\frac{R_2}{R_1 + R_2}\frac{gm_2}{C_2}\omega + \frac{gm_1 gm_2}{C_1 C_2}}{-\omega^2 + j\frac{R_1}{R_1 + R_2}\frac{gm_2}{C_2}\omega + \frac{gm_1 gm_2}{C_1 C_2}}$$

Then, the gain and phase characteristics $G(\omega)$ and $\phi(\omega)$ of the phase equalizer are:

$$G(\omega) = \sqrt{\frac{\left(\frac{gm_1 gm_2}{C_1 C_2} - \omega^2\right)^2 + \omega^2\left(\frac{R_2}{R_1 + R_2}\frac{gm_2}{C_2}\right)^2}{\left(\frac{gm_1 gm_2}{C_1 C_2} - \omega^2\right)^2 + \omega^2\left(\frac{R_1}{R_1 + R_2}\frac{gm_2}{C_2}\right)^2}} \quad (6)$$

$$\theta(\omega) = \text{Arc tan}\frac{-\frac{R_2}{R_1 + R_2}\frac{gm_2}{C_2}\omega}{\frac{gm_1 gm_2}{C_1 C_2} - \omega^2} - \text{Arc tan}\frac{\frac{R_1}{R_1 + R_2}\frac{gm_2}{C_2}\omega}{\frac{gm_1 gm_2}{C_1 C_2} - \omega^2}$$

Substituting the equation (5) into the equation (6), we have:

$$G(\omega) = 1$$

$$\theta(\omega) = -2\,\text{Arc tan}\frac{\frac{R_1}{R_1 + R_2}\frac{gm_2}{C_2}\omega}{\frac{gm_1 gm_2}{C_1 C_2} - \omega^2}$$

These equations describe the phase equalizer characteristics of which the gain is constant, and the phase is only variable.

In case that $R_1 \neq R_2$, for example, $R_1 > R_2$, the active filter serves as a band deemphasis filter (BDF) with a bottom of $Go = R_2/R_1 < 1$ at:

$$\omega_o = \sqrt{\frac{gm_1 gm_2}{C_1 C_2}}.$$

When $R_1 < R_2$, it serves as a band emphasis filter (BEF) with a peak of $Go = R_2/R_1 > 1$ at:

$$\omega_o = \sqrt{\frac{gm_1 gm_2}{C_1 C_2}}.$$

Figure 3:
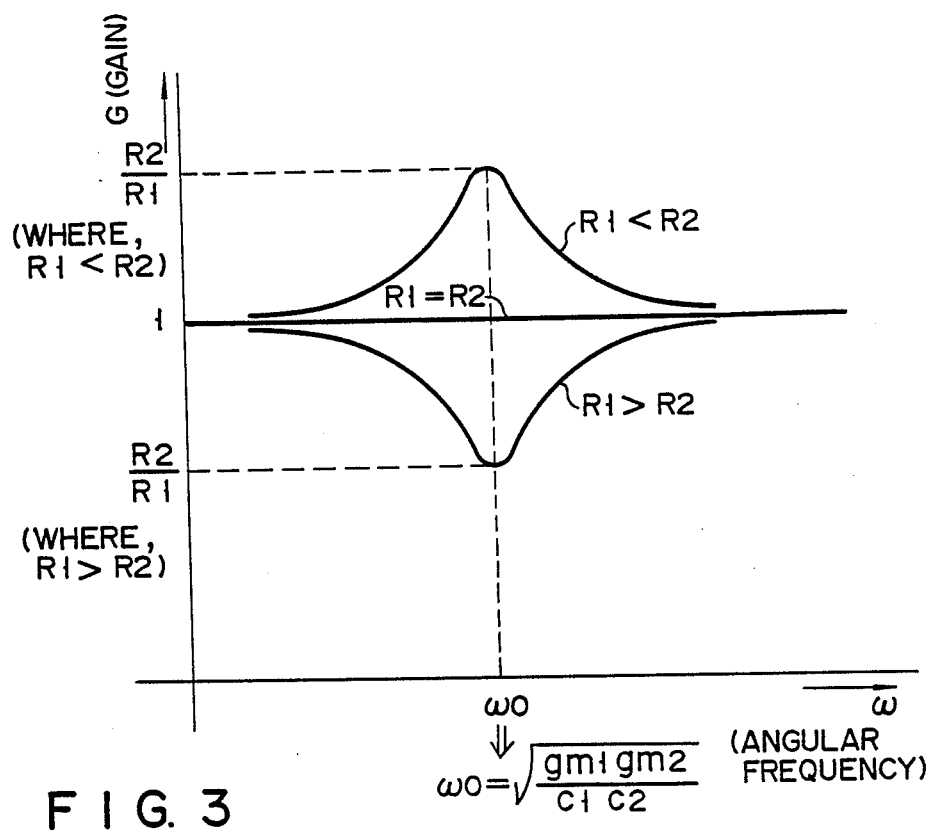
FIG. 3 shows a graph graphically illustrating the gain characteristics of the FIG. 1 circuit.

These three cases may be graphically described as is shown in FIG. 3.

It is noted here that OP AMPs $OP_1$, $OP_2$ are each a differential input type OP AMP with a single output terminal. When using the OP AMPs as shown in FIG. 2 for designing the active filter, only two OP AMPs are needed, simplifying the circuit construction.

In the prior art circuit, to set up the phase equalizer characteristics, it is necessary to make the difference between the conductance $gm_1$ and the conductance $gm_2$ equal to the conductance $gm_1$. On the other hand, in the circuit according to this embodiment, it is only necessary that the ratio of resistor $R_1$ and resistor $R_2$ is "1". Therefore, it is easy to set up the conditions for forming phase equalizer characteristics.

In other words, the active filter according to this invention does not require the elements well paired in value between the OP AMPs, except resistor $R_1$ and resistor $R_2$. In this respect, the circuit under discussion is suitable for IC fabrication.

Figure 4:
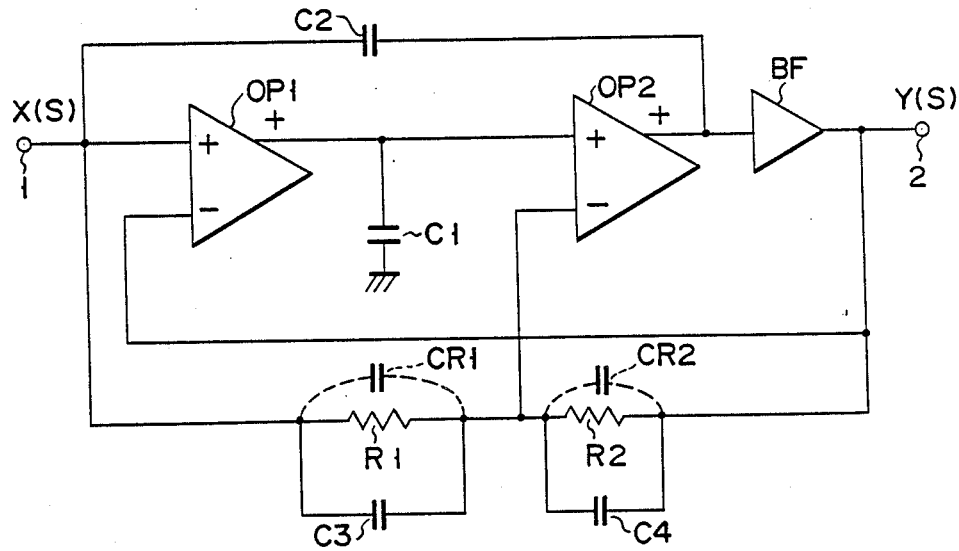
FIG. 4 shows a circuit diagram illustrating another embodiment of an active filter according to this invention.

FIG. 4 shows a second embodiment of an active filter according to this invention. As shown, capacitors $C_3$, $C_4$ ($C_3 = C_4$) are connected across resistors $R_1$, $R_2$, respectively. The remaining circuit arrangement is exactly the same as that of the FIG. 1 circuit. These capacitors $C_1$, $C_2$ do not have any influence on the phase equalizer characteristics. In practical use, parasitic capacitances $C_{R1}$, $C_{R2}$ may occur around resistors $R_1$, $R_2$, respectively, as shown. If such is its case that these parasitic capacitances are different, the difference adversely effects the equalizer characteristic, that is, it results in characteristic shifts. Such adverse effects can be substantially removed by the parallel capacitors $C_3$, $C_4$. Parasitic capacitances $C_{R1}$, $C_{R2}$ are generally very small. Therefore, in the FIG. 4 circuit, the following relation holds:

$$\left|\frac{C_{R2}}{C_{R1}} - 1\right| > \left|\frac{C_4 + C_{R2}}{C_3 + C_{R1}} - 1\right|$$

As seen from the above relation, the accuracy of the capacitance ratio is improved.

As described above, in the active filter of this invention, the output terminal of the buffer is connected to the negative input terminal of the first OP AMP. Two series of connected resistors are connected between the positive input terminal of the OP AMP and the output terminal of the buffer. The junction between these resistors is connected to the negative input terminal of the second OP AMP. This active filter can be used as a phase equalizer when the resistance of the resistors are equal to each other. The active filter is very suitable for IC fabrication.

What is claimed is:

1. An active filter comprising:

a signal input terminal coupled for reception with an input signal;

a first operational amplifier with positive and negative input terminals and a positive output terminal, said positive input terminal being connected to said signal input terminal, and said positive output terminal being grounded through a first capacitor;

a second operational amplifier with positive and negative input terminals and a positive output terminal, said positive input terminal being connected to the positive output terminal of said first operational amplifier, and said positive output terminal being connected to the positive input terminal of said first operational amplifier, through a second capacitor;

a buffer with input and output terminals, said input terminal being connected to the positive output terminal of said second operational amplifier, and said output terminal being connected to the negative input terminal of said first operational amplifier;

a first resistor connected at the first end to the positive input terminal of said first operational amplifier and connected at the second end to the negative input terminal of said second operational amplifier;

a second resistor connected at the first end to the second end of said first resistor, and at the second end to the output terminal of said buffer; and a signal output terminal connected to the output terminal of said buffer.

2. The active filter according to claim 1, wherein the resistance of said first resistor is larger than that of said second resistor, whereby said active filter serves as a band deemphasis filter.

3. The active filter according to claim 1, wherein the resistance of said first resistor is smaller than that of said second resistor, whereby said active filter serves as a band emphasis filter.

4. The active filter according to claim 1, further comprising a third capacitor connected in parallel with said first resistor; and a fourth capacitor connected in parallel with said second resistor and having a capacitance equal to that of said third capacitor.

5. The active filter according to claim 1, wherein said first and second operational amplifiers each include first to fourth transistors and a constant current source, said first to fourth transistors each have a base, a collector, and an emitter, said first transistor is an NPN transistor whose base is connected to said negative input terminal and whose emitter is connected to said constant current source, said second transistor is an NPN transistor whose base is connected to said positive input terminal and whose emitter is connected to said constant current source, said third transistor is a PNP transistor whose emitter is connected to an operation power supply and whose collector is connected to the collector of said first transistor and to said positive output terminal, and said fourth transistor is a PNP transistor whose emitter is connected to said operation power supply, whose collector is connected to the collector of said second transistor, and whose base is connected to the base of said third transistor and the collector of said fourth transistor.

6. A phase equalizer comprising:

a signal input terminal coupled for reception with an input signal;

a first operational amplifier with positive and negative input terminals and a positive output terminal, said positive input terminal being connected to said signal input terminal, and said positive output terminal being grounded through a first capacitor;

a second operational amplifier with positive and negative input terminals and a positive output terminal, said positive input terminal being connected to the positive output terminal of said first operational amplifier, and said positive output terminal being connected to the positive input terminal of said first operational amplifier, through a second capacitor;

a buffer with input and output terminals, said input terminal being connected to the positive output terminal of said second operational amplifier, and said output terminal being connected to the negative input terminal of said first operational amplifier;

a first resistor connected at the first end to the positive input end of said first operational amplifier and connected at the second end to the negative input terminal of said second operational amplifier;

a second resistor connected at the first end to the second end of said first resistor, and at the second end to the output terminal of said buffer, the resistance of said second resistor being equal to that of said first resistor; and a signal output terminal connected to the output terminal of said buffer.

7. The phase equalizer according to claim 6, wherein said first and second operational amplifiers each include first to fourth transistors and a constant current source, said first to fourth transistors each have a base, a collector, and an emitter, said first transistor is an NPN transistor whose base is connected to said negative input terminal and whose emitter is connected to said constant current source, said second transistor is an NPN transistor whose base is connected to said positive input terminal and whose emitter is connected to said constant current source, said third transistor is a PNP transistor whose emitter is connected to an operation power supply and whose collector is connected to the collector of said first transistor and to said positive output terminal, and said fourth transistor is a PNP transistor whose emitter is connected to said operation power supply, whose collector is connected to the collector of said second transistor, and whose base is connected to the base of said third transistor and the collector of said fourth transistor.

8. The phase equalizer according to claim 6, further comprising a third capacitor connected across said first resistor; and a fourth capacitor connected across said second resistor and having the capacitance equal to that of said third capacitor.

* * * * *